(12) United States Patent
Terry et al.

(10) Patent No.: US 9,913,289 B2
(45) Date of Patent: *Mar. 6, 2018

(54) METHOD AND APPARATUS FOR UPLINK HYBRID AUTOMATIC REPEAT REQUEST TRANSMISSION

(71) Applicant: InterDigital Technology Corporation, Wilmington, DE (US)

(72) Inventors: Stephen E. Terry, Northport, NY (US); Guodong Zhang, Syosset, NY (US)

(73) Assignee: INTERDIGITAL TECHNOLOGY CORPORATION, Wilmington, DE (US)

(*) Notice: Subject to any disclaimer, the term of this patent is extended or adjusted under 35 U.S.C. 154(b) by 0 days.

This patent is subject to a terminal disclaimer.

(21) Appl. No.: 14/952,235

(22) Filed: Nov. 25, 2015

(65) Prior Publication Data
US 2016/0088650 A1 Mar. 24, 2016

Related U.S. Application Data

(63) Continuation of application No. 14/090,872, filed on Nov. 26, 2013, now Pat. No. 9,209,944, which is a (Continued)

(51) Int. Cl.
| | |
|---|---|
| *H04L 1/18* | (2006.01) |
| *H04W 72/12* | (2009.01) |
| *H04L 1/08* | (2006.01) |
| *H04W 72/14* | (2009.01) |
| *H03M 13/00* | (2006.01) |

(52) U.S. Cl.
CPC .......... *H04W 72/1284* (2013.01); *H04L 1/08* (2013.01); *H04L 1/1812* (2013.01); (Continued)

(58) Field of Classification Search
None
See application file for complete search history.

(56) References Cited

U.S. PATENT DOCUMENTS

| | | | |
|---|---|---|---|
| 5,271,012 A | 12/1993 | Blaum et al. | |
| 5,612,950 A | 3/1997 | Young | |

(Continued)

FOREIGN PATENT DOCUMENTS

| | | |
|---|---|---|
| CN | 1433183 A | 7/2003 |
| EP | 1 207 647 | 5/2002 |

(Continued)

OTHER PUBLICATIONS

"Performance of Different HARQ Solutions in HSDPA and Solution Combination Tactics," Communication Theory and Signal Processing Annual Conference Proceedings, (2003).

(Continued)

*Primary Examiner* — M. Mujtaba Chaudry
(74) *Attorney, Agent, or Firm* — Volpe and Koenig, P.C.

(57) ABSTRACT

A method and wireless transmit/receive unit (WTRU) for uplink transmission are disclosed. A WTRU receives configuration information. The configuration information includes logical channel priority information and a maximum number of hybrid automatic repeat request (HARQ) transmissions. The WTRU receives an uplink grant for a transmission time interval (TTI). The WTRU identifies a HARQ process to use for uplink transmission for the TTI. The WTRU selects data for uplink transmission for the TTI. For a new uplink transmission, data associated with a highest priority is selected. The WTRU initializes a transmission counter. The transmission counter indicates a number of transmissions associated with the selected data. The WTRU transmits the selected data over an uplink channel based on the received uplink grant using the identified HARQ process.

10 Claims, 5 Drawing Sheets

Related U.S. Application Data continuation of application No. 12/685,466, filed on Jan. 11, 2010, now Pat. No. 8,621,310, which is a continuation of application No. 11/122,350, filed on May 5, 2005, now Pat. No. 7,647,541.

(60) Provisional application No. 60/568,931, filed on May 7, 2004.

(52) U.S. Cl.
CPC .......... *H04L 1/1816* (2013.01); *H04L 1/1877* (2013.01); *H04L 1/1887* (2013.01); *H04W 72/14* (2013.01); *H03M 13/6306* (2013.01); *H04L 1/1819* (2013.01)

(56) References Cited

U.S. PATENT DOCUMENTS

| | | | |
|---|---|---|---|
| 6,023,783 | A | 2/2000 | Divsalar et al. |
| 6,631,127 | B1 | 10/2003 | Ahmed et al. |
| 6,977,888 | B1 | 12/2005 | Frenger et al. |
| 7,027,782 | B2 | 4/2006 | Moon et al. |
| 7,054,316 | B2 | 5/2006 | Cheng et al. |
| 7,200,115 | B2 | 4/2007 | Khan et al. |
| 7,283,508 | B2 | 10/2007 | Choi et al. |
| 7,286,540 | B2 * | 10/2007 | Kim ............... H04L 1/0003 370/394 |
| 7,310,336 | B2 * | 12/2007 | Malkamaki ....... H04L 1/0083 370/349 |
| 7,436,795 | B2 | 10/2008 | Jiang |
| 2002/0001296 | A1 | 1/2002 | Lee et al. |
| 2002/0071407 | A1 | 6/2002 | Koo et al. |
| 2003/0043764 | A1 * | 3/2003 | Kim ................ H04L 1/0003 370/329 |
| 2003/0086391 | A1 | 5/2003 | Terry et al. |
| 2003/0147348 | A1 * | 8/2003 | Jiang ............... H04L 1/1841 370/229 |
| 2003/0147474 | A1 | 8/2003 | Ha et al. |
| 2004/0037224 | A1 * | 2/2004 | Choi ................ H04L 1/1812 370/235 |
| 2004/0085934 | A1 | 5/2004 | Balachandran et al. |
| 2004/0116143 | A1 * | 6/2004 | Love ............... H04L 1/1845 455/522 |
| 2004/0233887 | A1 | 11/2004 | Meiling et al. |
| 2005/0041588 | A1 | 2/2005 | Kim et al. |
| 2005/0159185 | A1 | 7/2005 | Hiramatsu |
| 2005/0207359 | A1 | 9/2005 | Hwang et al. |
| 2006/0092972 | A1 | 5/2006 | Petrovic et al. |

FOREIGN PATENT DOCUMENTS

| | | |
|---|---|---|
| EP | 1 389 848 | 2/2004 |
| EP | 1 418 785 | 5/2004 |
| JP | 10-210530 | 8/1998 |
| JP | 2002-077293 | 3/2002 |
| JP | 2003-198556 | 7/2003 |
| JP | 2003-318804 | 11/2003 |
| JP | 2004-048474 | 2/2004 |
| KR | 2002-0081840 | 10/2002 |
| WO | 02/069547 | 9/2002 |
| WO | 03/019960 | 3/2003 |
| WO | 03/096600 | 11/2003 |
| WO | 2004/019543 | 3/2004 |
| WO | 2004/073273 | 8/2004 |

OTHER PUBLICATIONS

3GPP, "3rd Generation Partnership Project; Technical Specification Group Radio Access Network; FDD Enhanced Uplink; Overall Description; Stage 2 (Release 6)," 3GPP TS 25.309 V6.2.0, (Mar. 2005).

3GPP, "3rd Generation Partnership Project; Technical Specification Group Radio Access Network; Medium Access Control (MAC) Protocol Specification (Release 1999)," 3GPP TS 25.321 V3.16.0, (Sep. 2003).

3GPP, "3rd Generation Partnership Project; Technical Specification Group Radio Access Network; Medium Access Control (MAC) Protocol Specification (Release 1999)," 3GPP TS 25.321 V3.17.0, (Jun. 2004).

3GPP, "3rd Generation Partnership Project; Technical Specification Group Radio Access Network; Medium Access Control (MAC) Protocol Specification (Release 4)," 3GPP TS 25.321 V4.9.0, (Sep. 2003).

3GPP, "3rd Generation Partnership Project; Technical Specification Group Radio Access Network; Medium Access Control (MAC) Protocol Specification (Release 4)," 3GPP TS 25.321 V4.10.0, (Jun. 2004).

3GPP, "3rd Generation Partnership Project; Technical Specification Group Radio Access Network; Medium Access Control (MAC) Protocol Specification (Release 5)," 3GPP TS 25.321 V5.8.0, (Mar. 2004).

3GPP, "3rd Generation Partnership Project; Technical Specification Group Radio Access Network; Medium Access Control (MAC) Protocol Specification (Release 5)," 3GPP TS 25.321 V5.10.0, (Dec. 2004).

3GPP, "3rd Generation Partnership Project; Technical Specification Group Radio Access Network; Medium Access Control (MAC) Protocol Specification (Release 6)," 3GPP TS 25.321 V6.1.0, (Mar. 2004).

3GPP, "3rd Generation Partnership Project; Technical Specification Group Radio Access Network; Medium Access Control (MAC) Protocol Specification (Release 6)," 3GPP TS 25.321 V6.4.0, (Mar. 2005).

3GPP, "3rd Generation Partnership Project; Technical Specification Group Radio Access Network; Radio Resource Control (RRC) protocol specification (Release 1999)," 3GPP TS 25.331 V3.18.0 (Mar. 2004).

3GPP, "3rd Generation Partnership Project; Technical Specification Group Radio Access Network; Radio Resource Control (RRC) protocol specification (Release 1999)," 3GPP TS 25.331 V3.21.0 (Dec. 2004).

3GPP, "3rd Generation Partnership Project; Technical Specification Group Radio Access Network; Radio Resource Control (RRC); Protocol Specification (Release 4)," 3GPP TS 25.331 V4.13.0 (Mar. 2004).

3GPP, "3rd Generation Partnership Project; Technical Specification Group Radio Access Network; Radio Resource Control (RRC); Protocol Specification (Release 4)," 3GPP TS 25.331 V4.17.0 (Mar. 2005).

3GPP, "3rd Generation Partnership Project; Technical Specification Group Radio Access Network; Radio Resource Control (RRC); Protocol Specification (Release 5)," 3GPP TS 25.331 V5.8.0 (Mar. 2004).

3GPP, "3rd Generation Partnership Project; Technical Specification Group Radio Access Network; Radio Resource Control (RRC); Protocol Specification (Release 5)," 3GPP TS 25.331 V5.12.1 (Mar. 2005).

3GPP, "3rd Generation Partnership Project; Technical Specification Group Radio Access Network; Radio Resource Control (RRC); Protocol Specification (Release 6)," 3GPP TS 25.331 V6.1.0 (Mar. 2004).

3GPP, "3rd Generation Partnership Project; Technical Specification Group Radio Access Network; Radio Resource Control (RRC); Protocol Specification (Release 6)," 3GPP TS 25.331 V6.5.0 (Mar. 2005).

3GPP, "3rd Generation Partnership Project; Technical Specification Group Radio Access Network; Feasibility Study for Enhanced Uplink for UTRA FDD (Release 6)," 3GPP TR 25.896 V6.0.0 (Mar. 2004).

Ghosh et al. "Overview of Enhanced Uplink for 3GPP W-CDMA" IEEE, 2004, pp. 2261-2265.

Nokia, "HARQ overview," TSG-RAN WG1 #31 meeting, R1-03-0176 (Feb. 18-21, 2003).

Rosa et al. "Performance of Fast Node B Scheduling and L1 HARQ Schemes in WCDMA Uplink Packet Access" IEEE, 2004, pp. 1635-1639.

(56) References Cited

OTHER PUBLICATIONS

Wong et al., "A Type-I Hybrid ARQ Protocol Over Optimal Sequence CDMA Link," Proceedings of the 21st Century Military Communications Conference, pp. 559-563 (2000).

* cited by examiner

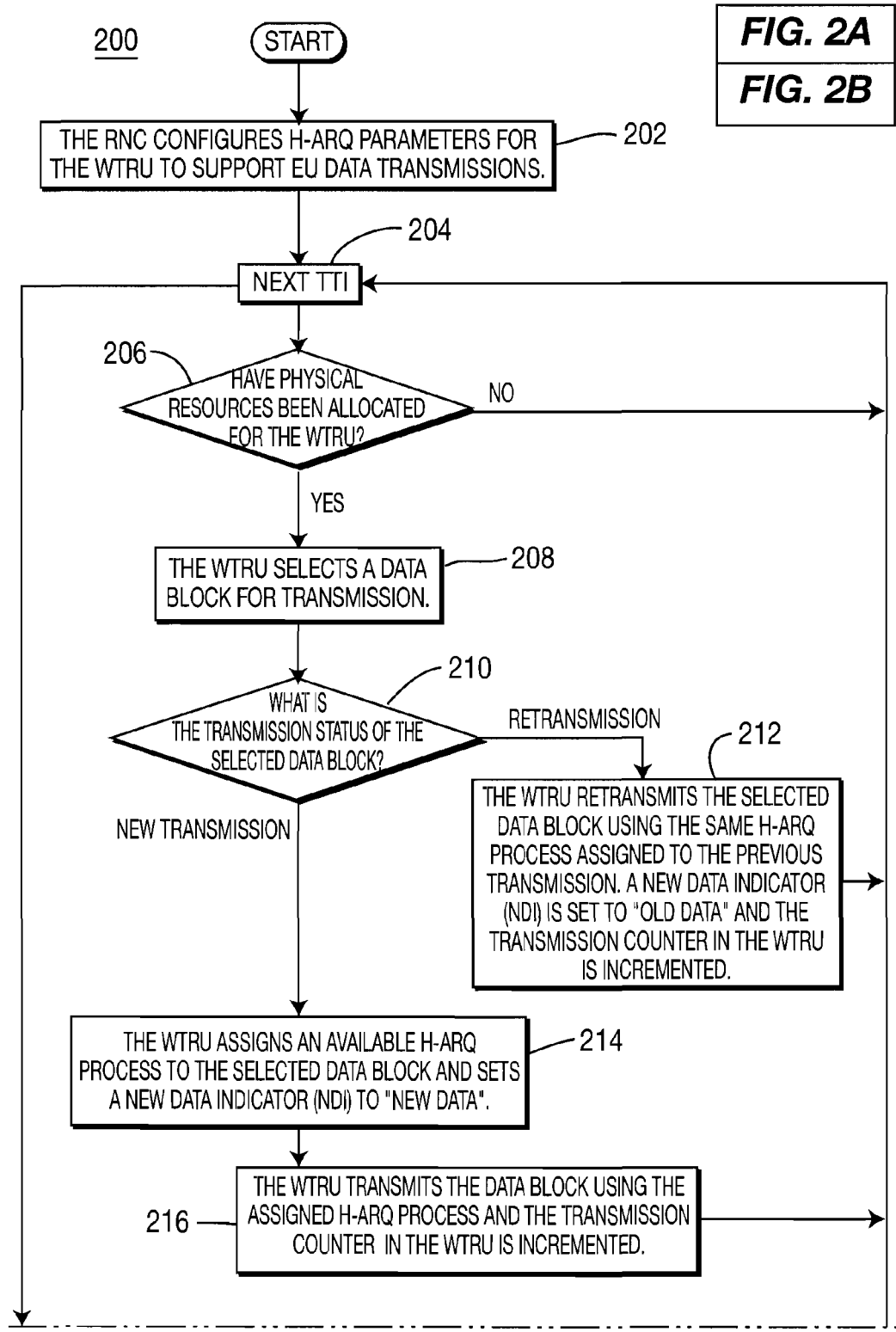

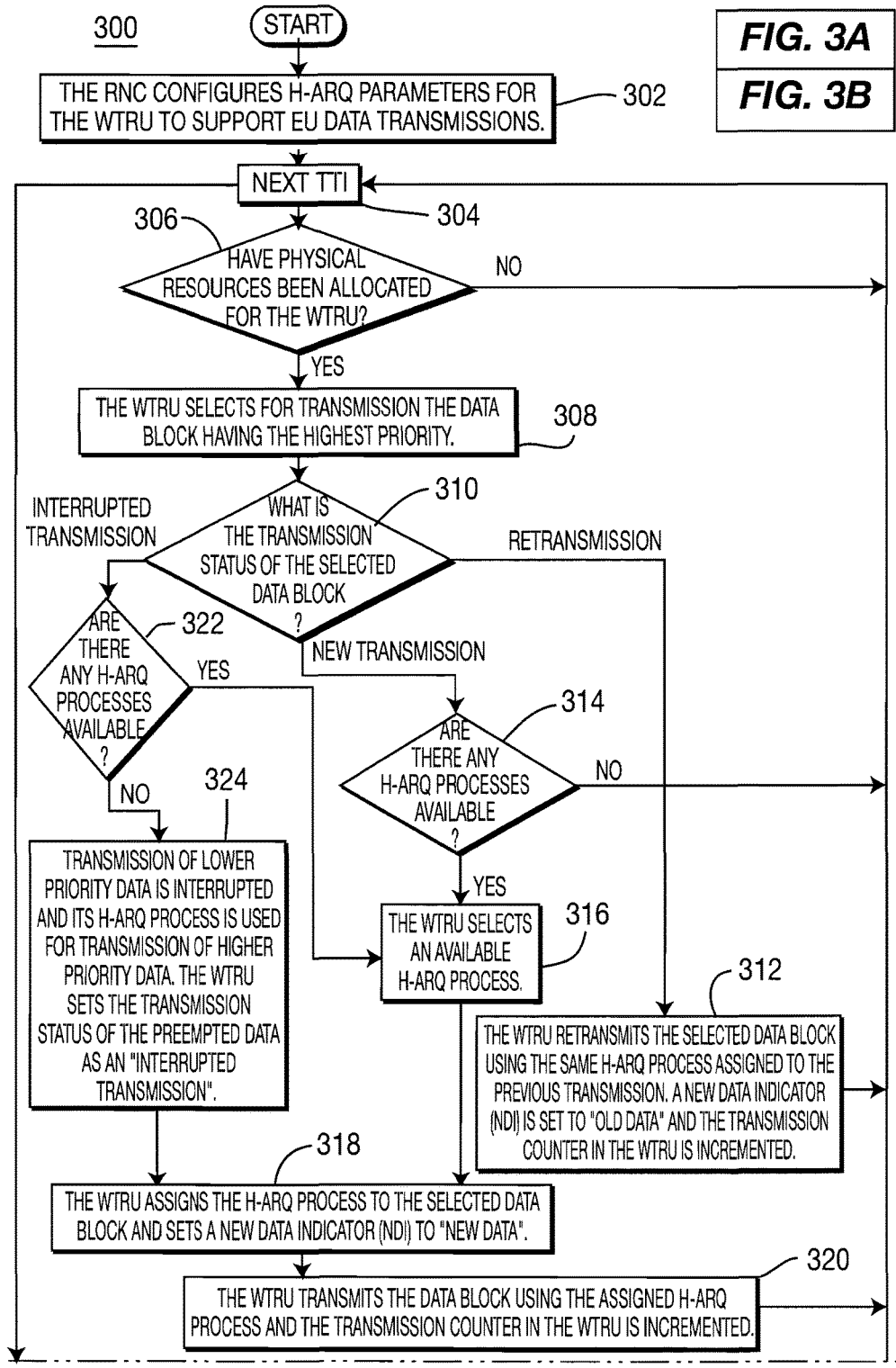

METHOD AND APPARATUS FOR UPLINK HYBRID AUTOMATIC REPEAT REQUEST TRANSMISSION

CROSS REFERENCE TO RELATED APPLICATION

This application is a continuation of U.S. patent application Ser. No. 14/090,872 filed Nov. 26, 2013, which is a continuation of U.S. application Ser. No. 12/685,466 filed Jan. 11, 2010, which issued as U.S. Pat. No. 8,621,310 on Dec. 31, 2013, which is a continuation of U.S. patent application Ser. No. 11/122,350 filed May 5, 2005, which issued as U.S. Pat. No. 7,647,541 on Jan. 12, 2010, which claims the benefit of U.S. Provisional Application No. 60/568,931 filed May 7, 2004, all of which is incorporated by reference as if fully set forth.

FIELD OF INVENTION

The present invention is related to a wireless communication system including at least one wireless transmit/receive unit (WTRU), at least one Node-B and a radio network controller (RNC). More particularly, the present invention is related to a method and apparatus for assigning automatic repeat request (ARQ)/hybrid automatic repeat request (H-ARQ) processes in the WTRU for supporting enhanced uplink (EU) transmissions.

BACKGROUND

Methods for improving uplink (UL) coverage, throughput and transmission latency are being investigated in the Third Generation Partnership Project (3GPP). In order to achieve these goals, scheduling and assigning of UL physical resources will be moved from the RNC to the Node-B.

The Node-B can make decisions and manage UL radio resources on a short-term basis better than the RNC. However, the RNC still retains coarse overall control of the cell with EU services so that the RNC can perform functions such as call admission control and congestion control.

A new medium access control (MAC) entity called MAC-e is created in a WTRU and the Node-B to handle the transmission and reception of enhanced dedicated channel (E-DCH) transmissions. There may be several independent uplink transmissions processed between the WTRU and UMTS terrestrial radio access network (UTRAN) within a common time interval. One example of this is MAC layer H-ARQ or MAC layer ARQ operation where each individual transmission may require a different number of transmissions to be successfully received by the UTRAN. Proper assignment of data blocks to ARQ/H-ARQ processes for transmission is necessary for operation of the EU services. This function includes rules for retransmitting failed transmissions, prioritization between different logical channels and provisioning of quality of service (QoS) related parameters.

SUMMARY

A method and apparatus for assigning a hybrid-automatic repeat request (H-ARQ) process in a wireless transmit/receive unit (WTRU) to support enhanced uplink (EU) data transmission are disclosed. Configuration parameters for enhanced uplink (EU) operation are received. The configuration parameters include a priority associated with a medium access control for dedicated channel (MAC-d) flow and a maximum number of H-ARQ retransmissions associated with the MAC-d flow. Data is selected for transmission over an enhanced dedicated channel (E-DCH) based on a priority of the MAC-d flow, wherein data with the highest priority is selected. On a condition that the selected data is new data that was not previously transmitted, an available H-ARQ process is assigned for supporting transmission of the selected data, and the selected data is transmitted over the E-DCH using the assigned H-ARQ process. On a condition that the selected data was previously transmitted, the selected data is retransmitted over the E-DCH using the same H-ARQ process that was assigned to previously transmit the selected data. A transmission count is incremented in response to transmitting or retransmitting the selected data. A determination is made of whether the transmission count is at least equal to the maximum number of H-ARQ retransmissions. The selected data is discarded in response to a determination that the transmission count is at least equal to the maximum number of H-ARQ retransmissions.

BRIEF DESCRIPTION OF THE DRAWINGS

A more detailed understanding of the invention may be had from the following description of a preferred embodiment, given by way of example and to be understood in conjunction with the accompanying drawing wherein:

FIG. 2A is a flow diagram of an EU transmission process implemented by the system of FIG. 1 for assigning an ARQ or H-ARQ process in accordance with one embodiment of the present invention;

FIG. 3A is a flow diagram of an EU transmission process implemented by the system of FIG. 1 for assigning an ARQ or H-ARQ process using preemption and re-initiation procedures in accordance with another embodiment of the present invention.

DETAILED DESCRIPTION OF THE PREFERRED EMBODIMENTS

Hereafter, the terminology "WTRU" includes but is not limited to a user equipment (UE), a mobile station, a fixed or mobile subscriber unit, a pager, or any other type of device capable of operating in a wireless environment. When referred to hereafter, the terminology "Node-B" includes but is not limited to a base station, a site controller, an access point or any other type of interfacing device in a wireless environment.

The features of the present invention may be incorporated into an integrated circuit (IC) or be configured in a circuit comprising a multitude of interconnecting components.

Hereafter, for simplicity, the present invention will be explained with reference to H-ARQ operation. However, it should be noted that the present invention is equally applicable to ARQ operation without affecting the functionality of the present invention.

Figure 1:
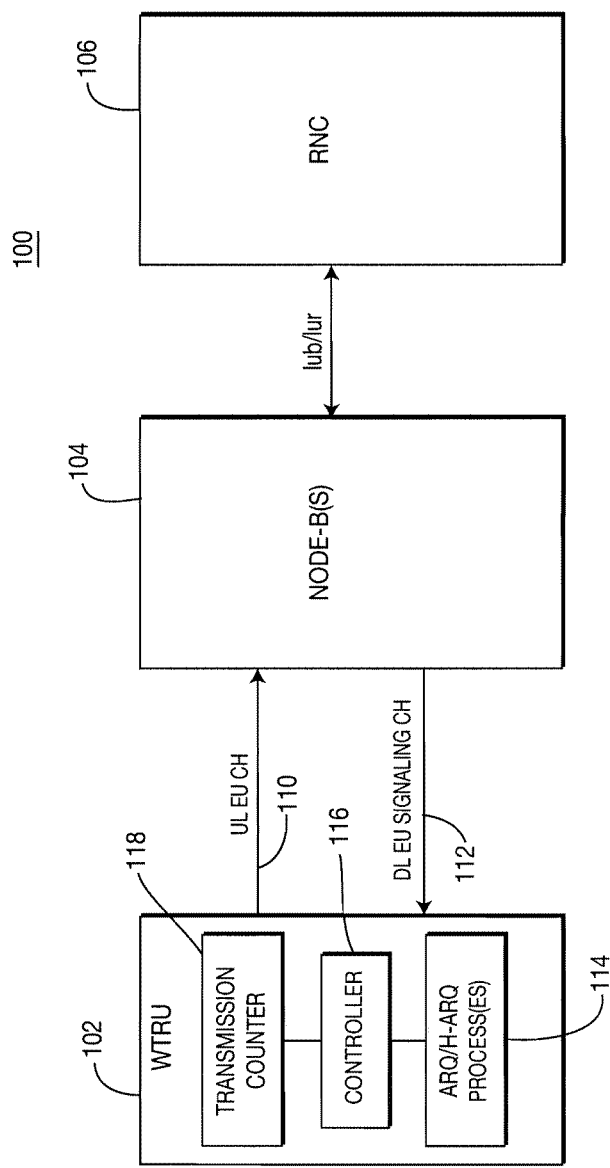
FIG. 1 is a block diagram of a wireless communication system operating in accordance with the present invention.

FIG. 1 is a block diagram of a wireless communication system 100 operating in accordance with the present invention. The system 100 includes at least one WTRU 102, at least one Node-B 104 and an RNC 106. The RNC 106 controls overall EU operation by configuring EU parameters for the Node-B 104 and the WTRU 102, such as priority of each TrCH, MAC-d flow or logical channel mapped on an E-DCH, maximum number of transmissions for each TrCH or logical channel, maximum allowed EU transmit power or available channel resources per Node-B 104. The WTRU 102 sends a channel allocation request via the UL EU channel 110 and receives channel allocation information via the DL EU signaling channel 112. The WTRU 102 transmits E-DCH data via a UL EU channel 110 to the Node-B 104 in accordance with the channel allocation information. The Node-B 104 sends feedback information on the data block via the DL EU signaling channel 112 to the WTRU 102.

In accordance with the present invention, the assignment of an H-ARQ process for supporting a data transmission is controlled by the WTRU 102. The Node-B 104 provides allocation of physical resources for which the WTRU 102 determines what data will be transmitted using which H-ARQ process. The WTRU 102 includes a pool of H-ARQ processes 114, a controller 116 and a transmission counter 118.

The controller 116 controls the overall assignment of H-ARQ processes including selecting data for transmission based on priority, assigning one of the available H-ARQ processes 114 to the selected data and releasing H-ARQ processes 114 when the data transmission is successfully completed.

The transmission counter 118 indicates the number of transmissions for a given H-ARQ process, which is equivalent to a receive sequence number (RSN). The transmission counter 118 may also be used as a new data indicator (NDI).

In one embodiment, a preemption procedure is used to manage E-DCH transmissions, whereby the assignment of the H-ARQ processes is based on absolute priority. The highest priority class traffic and the earliest transmission number within the same priority class takes precedence over other transmissions. The transmission of a data block is also subject to a maximum number of H-ARQ transmissions for each E-DCH TrCH, or each logical channel mapped to an E-DCH TrCH. An H-ARQ process servicing a lower priority data transmission may be superceded by a higher priority data transmission.

In another embodiment, a re-initiation procedure is used to manage E-DCH transmissions, whereby if at least one of a transmission time limit and a maximum number of transmissions has been reached, the lower priority data transmission may be reassigned to an H-ARQ process.

FIG. 2A is a flow diagram of an EU transmission process 200 implemented by the system 100 of FIG. 1 for assigning H-ARQ processes 114 in accordance with one embodiment of the present invention. When a radio access bearer (RAB) is configured to operate on an E-DCH, parameters related to assigning H-ARQ processes 114 in the WTRU 102 are configured by the RNC 106 to support EU data transmissions (step 202). The parameters include, but are not limited to, priority of each logical channel, MAC-d flow or TrCH mapped to an E-DCH, and maximum number of H-ARQ transmissions for each TrCH, MAC-d flow or logical channel mapped to an E-DCH.

For each transmit time interval (TTI) at step 204, the WTRU 102 then determines whether physical resources have been allocated for the WTRU 102 for supporting EU operation (step 206). If physical resources have not been allocated at step 206, the process 200 returns to step 204 until the next TTI occurs. If physical resources have been allocated at step 206, the WTRU 102 selects a data block for transmission (step 208). For new data transmissions, the highest priority data block is selected for each assigned H-ARQ process. In step 210, the WTRU 102 then determines a transmission status of the selected data. The transmission status is set as either "new transmission" or "retransmission."

If, in step 210, the WTRU 102 determines that the transmission status of the selected data is "retransmission", the same H-ARQ process 114 that was used for the previous transmission remains assigned to the data block, the transmission counter 118 in the WTRU 102 is incremented, and an NDI of the transmission is set to "old data" to indicate that the assigned H-ARQ process 114 retransmits data identical to what was transmitted previously, in order to allow for combining at the Node-B 104 (step 212). The process 200 then returns to step 204 until the next TTI occurs.

If, in step 210, the WTRU 102 determines that the transmission status of the selected data block is "new transmission", the WTRU 102 assigns an available H-ARQ process 114 to the selected data block and sets an NDI to indicate "new data" (step 214). The data block is then transmitted using the assigned H-ARQ process and the transmission counter 118 in the WTRU 102 is incremented (step 216). The process 200 then returns to step 204 until the next TTI occurs.

Figure 2B:
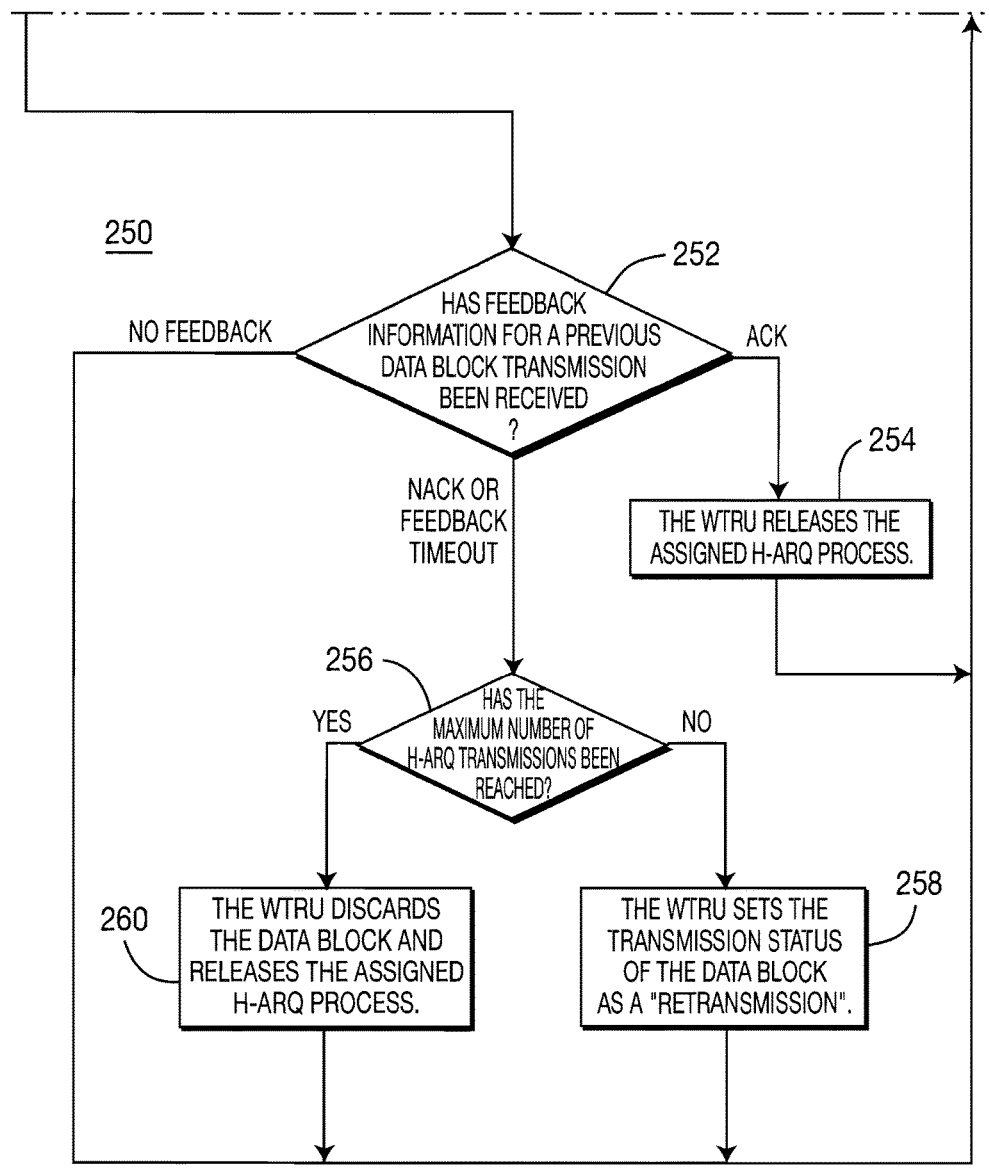
FIG. 2B is a flow diagram of an EU feedback reception process implemented by the system of FIG. 1.

FIG. 2B is a flow diagram of an EU feedback reception process 250 implemented by the system 100 of FIG. 1. In step 252, the WTRU 102 determines whether feedback information for a previously transmitted data block has been received. If the WTRU 102 received an ACK message, the corresponding H-ARQ process 114 is released and is available for supporting another data transmission (step 254). If the WTRU 102 received a NACK message or a feedback timeout occurs, the WTRU 102 determines whether the transmission counter 118 in the WTRU 102 has reached a predetermined maximum number of H-ARQ transmissions (step 256).

If the number of H-ARQ transmissions indicated by the transmission counter 118 in the WTRU 102 has not reached a predetermined maximum number at step 256, the transmission status of the data block is set as a "retransmission" (step 258).

If the maximum number of H-ARQ transmissions is reached at step 256, the WTRU discards the data at the MAC layer and releases the associated H-ARQ process (step 260).

FIG. 3A is a flow diagram of an EU transmission process 300 implemented by the system 100 of FIG. 1 for assigning H-ARQ processes 114 using preemption and re-initiation procedures in accordance with another embodiment of the present invention. When a RAB is configured to operate on an E-DCH, parameters related to assigning H-ARQ processes 114 in the WTRU 102 are configured by the RNC 106 to support EU data transmissions (step 302).

For each transmit time interval (TTI) at step 304, the WTRU 102 then determines whether physical resources have been allocated for the WTRU 102 for supporting EU operation (step 306). A priority class is configured for each logical channel, MAC-d flow or TrCH mapped to an E-DCH, whereby the highest priority data block is always serviced first. If physical resources have not been allocated at step 306, the process 300 returns to step 304 until the next TTI occurs. If physical resources have been allocated at step 306, the WTRU 102 selects for transmission the data block having the highest priority from all possible data that can be transmitted in the current TTI, (i.e., new data, previous unsuccessful transmissions and interrupted transmissions), (step 308). If several data blocks having the same highest priority are available for transmission, the WTRU 102 may prioritize the data block having the earliest sequence number or the data block having the highest number of transmissions. This operation assists "first-in first-out" (FIFO) processing and minimizes the delay for any data transmission. In step 310, the WTRU 102 then determines a transmission status of the selected data. The transmission status is set as either "new transmission," "retransmission" or "interrupted transmission."

If the data block has not been previously transmitted, or an H-ARQ transmission is restarted, the transmission status is set as a "new transmission" in step 310. If the data block has been transmitted but was not successfully delivered, (and not interrupted by a higher priority data block), the transmission status of the data is set as a "retransmission" at step 310. The WTRU 102 may optionally implement preemption of an H-ARQ process assigned to support higher priority data. An H-ARQ process already assigned for lower priority data which needs to be transmitted may be preempted with higher priority data when there is no other H-ARQ process available. If the H-ARQ process assigned to the data block is preempted, the lower priority data is blocked from transmission in the current TTI and the transmission status of the blocked data is set as an "interrupted transmission" at step 310.

If, in step 310, the WTRU 102 determines that the transmission status of the selected data is "retransmission", the same H-ARQ process 114 that was used for the previous transmission remains assigned to the data block, a transmission counter 118 is incremented and an NDI of the transmission is set to "old data" to indicate that the assigned H-ARQ process 114 retransmits data identical to what was transmitted previously, in order to allow for combining at the Node-B 104 (step 312). The process 300 then returns to step 304 until the next TTI occurs.

If, in step 310, the WTRU 102 determines that the transmission status of the selected data block is "new transmission", the WTRU 102 determines whether there are any H-ARQ processes 114 available (step 314). If an H-ARQ process is available, (or a process supporting lower priority data is available), one of the available H-ARQ processes 114 is selected (step 316). If the transmission status of the selected data block is a "new transmission," the WTRU 102 selects an available H-ARQ process 114 (step 316). The WTRU 102 assigns the selected H-ARQ process 114 to the selected data block and sets an NDI to indicate "new data" (step 318). The data block is then transmitted using the assigned H-ARQ process and the transmission counter 118 in the WTRU 102 is incremented (step 320). The process 300 then returns to step 304 until the next TTI occurs.

If, in step 310, the WTRU 102 determines that the transmission status of the selected data block is "interrupted transmission", (which is the case for which preemption is permitted), the WTRU 102 determines whether there are any H-ARQ processes 114 available (step 322). If there are no H-ARQ processes 114 available at step 322, transmission of a lower priority data block is interrupted and a transmission status of the interrupted lower priority data is set to "interrupted transmission" (step 324). The H-ARQ process 114 previously assigned for the lower priority data is assigned for the currently selected data block and an NDI is set to indicate new data (step 318). The data block is then transmitted using the assigned H-ARQ process and the transmission counter 118 in the WTRU 102 is incremented (step 320). The process 300 then returns to step 304 until the next TTI occurs.

Figure 3B:
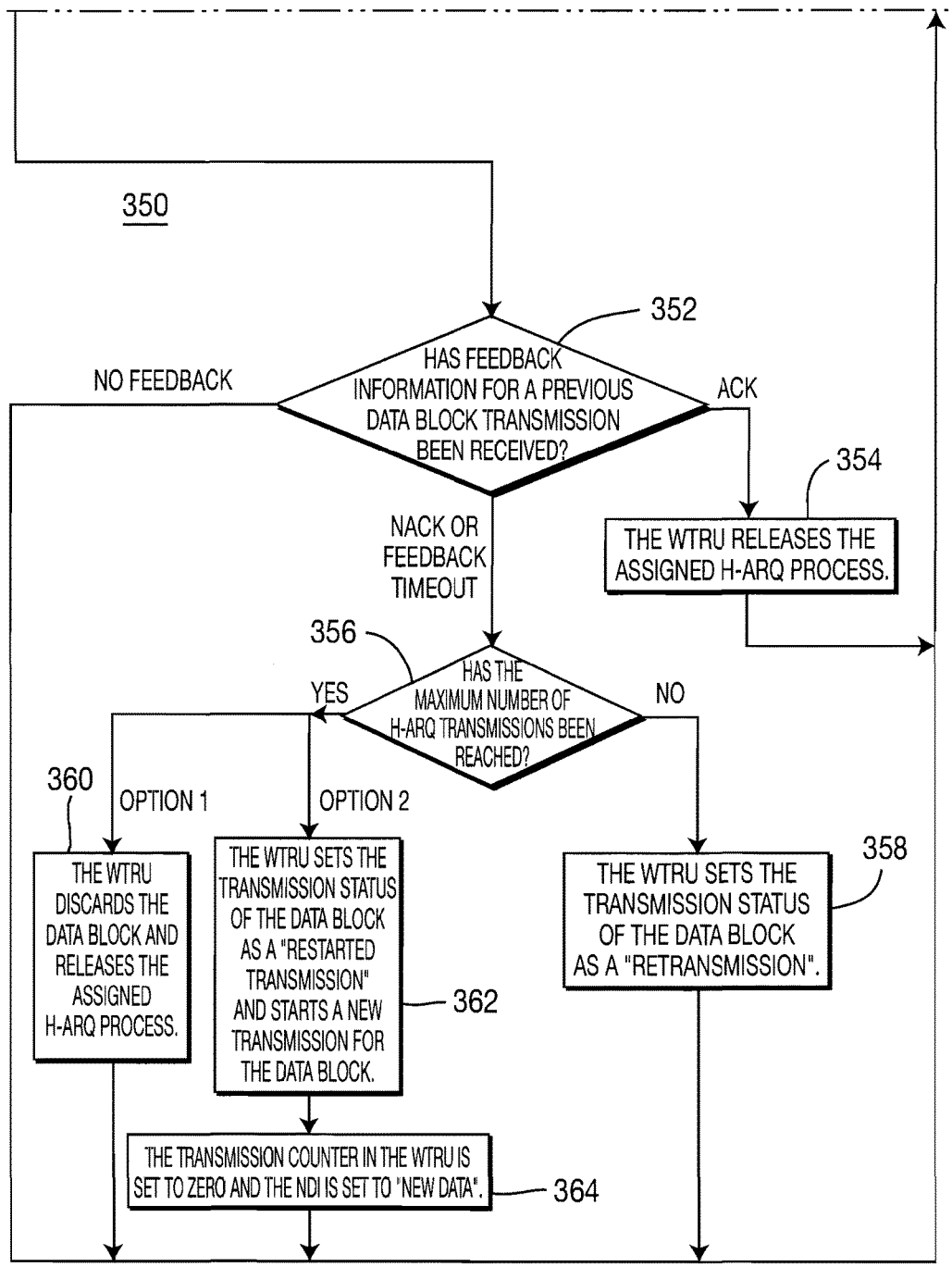
FIG. 3B is a flow diagram of an EU feedback reception process implemented by the system of FIG. 1.

FIG. 3B is a flow diagram of an EU feedback reception process 350 implemented by the system 100 of FIG. 1. In step 352, the WTRU 102 determines whether feedback information for a previously transmitted data block has been received. If the WTRU 102 received an ACK message, the corresponding H-ARQ process 114 is released and is available for supporting another data transmission (step 354). If the WTRU 102 received a NACK message or a feedback timeout occurs, the WTRU 102 determines whether the number of H-ARQ transmissions indicated by the transmission counter 118 in the WTRU 102 has reached a predetermined maximum number of H-ARQ transmissions (step 356).

If the maximum number of H-ARQ transmissions has not been reached at step 356, the transmission status of the data block is set as a "retransmission" (step 358).

If the maximum number of H-ARQ transmissions is reached at step 356, the WTRU 102 has two options 360, 362. In the first option 360, the WTRU 102 discards the data block at the MAC layer and releases the assigned H-ARQ process 114. In the second option 362, the WTRU 102 may set the transmission status of the data block as a "restarted transmission" and starts a new transmission for the data block. The transmission counter 118 is then set to zero and the NDI is set to "new data" (step 364).

Although the features and elements of the present invention are described in the preferred embodiments in particular combinations, each feature or element can be used alone without the other features and elements of the preferred embodiments or in various combinations with or without other features and elements of the present invention.

What is claimed is:

1. A method for uplink transmission implemented by a wireless transmit/receive unit (WTRU), the method comprising:
    receiving configuration information, wherein the configuration information includes logical channel priority information and a maximum number of hybrid automatic repeat request (HARQ) transmissions;
    receiving an uplink grant for a transmission time interval (TTI);
    identifying a HARQ process to use for uplink transmission of new data for the TTI, wherein the new data was not previously transmitted using the identified HARQ process;
    selecting data for an uplink transmission for the TTI that includes highest priority data;
    setting a transmission counter associated with the identified HARQ process to zero; and
    transmitting the selected data over an uplink channel based on the received uplink grant using the identified HARQ process.

2. The method of claim 1 further comprising incrementing the transmission counter on a condition that a retransmission is requested.

3. The method of claim 1 further comprising determining whether the selected data was transmitted a maximum number of times.

4. The method of claim 1 further comprising discarding the selected data on a condition that the selected data was transmitted a maximum number of times.

5. The method of claim 1 further comprising retransmitting the selected data on a condition that the WTRU receives feedback information indicating that reception of the data transmission was unsuccessful.

6. A wireless transmit/receive unit (WTRU) comprising:
    at least one circuit configured to receive configuration information, wherein the configuration information includes logical channel priority information and a maximum number of hybrid automatic repeat request (HARQ) transmissions;

the at least one circuit configured to receive an uplink grant for a transmission time interval (TTI);

the at least one circuit configured to identify a HARQ process to use for uplink transmission of new data for the TTI, wherein the new data was not previously transmitted using the identified HARQ process;

the at least one circuit configured to select data for an uplink transmission for the TTI that includes highest priority data;

the at least one circuit configured to set a transmission counter associated with the identified HARQ process to zero; and the at least one circuit configured to transmit the selected data over an uplink channel based on the received uplink grant using the identified HARQ process.

7. The WTRU of claim 6, wherein the at least one circuit is further configured to increment the transmission counter on a condition that a retransmission is requested.

8. The WTRU of claim 6, wherein the at least one circuit is further configured to determine whether the selected data was transmitted a maximum number of times.

9. The WTRU of claim 6, wherein the at least one circuit is further configured to discard the selected data on a condition that the selected data was transmitted a maximum number of times.

10. The WTRU of claim 6, wherein the at least one circuit is further configured to retransmit the selected data on a condition that the WTRU receives feedback information indicating that reception of the data transmission was unsuccessful.

* * * * *